(12) United States Patent
Yuan et al.

(10) Patent No.: US 10,855,825 B2
(45) Date of Patent: Dec. 1, 2020

(54) FLEXIBLE DISPLAY SUBSTRATES AND DISPLAY DEVICES

(71) Applicant: KunShan Go-Visionox Opto-Electronics Co., Ltd., Kunshan (CN)

(72) Inventors: Bo Yuan, Kunshan (CN); Xiuqi Huang, Kunshan (CN); Kun Hu, Kunshan (CN); Genmao Huang, Kunshan (CN); Lin Xu, Kunshan (CN); Xinnan Wang, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/535,504

(22) Filed: Aug. 8, 2019

(65) Prior Publication Data
US 2019/0364142 A1 Nov. 28, 2019

Related U.S. Application Data

(63) Continuation of application No. PCT/CN2018/090260, filed on Jun. 7, 2018.

(30) Foreign Application Priority Data

Aug. 31, 2017 (CN) .................. 2017 2 1111099 U

(51) Int. Cl.
*B32B 7/02* (2019.01)
*H04M 1/02* (2006.01)
*H01L 51/00* (2006.01)

(52) U.S. Cl.
CPC ...... *H04M 1/0268* (2013.01); *H01L 51/0097* (2013.01); *H01L 2251/558* (2013.01); *H04M 2201/38* (2013.01)

(58) Field of Classification Search
CPC .............. G09F 9/30; H01L 2251/5338; H01L 2251/558; H01L 27/3244; H01L 51/0097;
(Continued)

(56) References Cited

U.S. PATENT DOCUMENTS

| | | | | |
|---|---|---|---|---|
| 2014/0217373 A1* | 8/2014 | Youn | .................. | H01L 51/5203 257/40 |
| 2014/0217397 A1* | 8/2014 | Kwak | ................ | H01L 27/1218 257/43 |

FOREIGN PATENT DOCUMENTS

| | | |
|---|---|---|
| CN | 105474290 A | 4/2016 |
| CN | 106783880 A | 5/2017 |

(Continued)

OTHER PUBLICATIONS

International Searching Authority, PCT Written Opinion of PCT/CN2018/090260 dated Aug. 22, 2018.
(Continued)

*Primary Examiner* — Lawrence D Ferguson
(74) *Attorney, Agent, or Firm* — Rimon PC

(57) ABSTRACT

A flexible display substrate includes a flexible substrate and a conductive layer on the flexible substrate. The conductive layer and the flexible substrate are divided into a bending area and a non-bending area along an extension direction. A thickness of the conductive layer in the bending area is smaller than a thickness of the conductive layer in the non-bending area.

13 Claims, 3 Drawing Sheets

(58) Field of Classification Search
CPC ... H04M 1/0268; H04M 2201/38; H05K 1/02
See application file for complete search history.

(56) References Cited

FOREIGN PATENT DOCUMENTS

| | | |
|---|---|---|
| CN | 106920829 A | 7/2017 |
| CN | 106952937 A | 7/2017 |
| CN | 107079579 A | 8/2017 |
| CN | 207134069 U | 3/2018 |
| JP | 2001013884 A | 1/2001 |

OTHER PUBLICATIONS

PCT International Search Report dated Aug. 22, 2018 in International Application No. PCT/CN2018/090260.

* cited by examiner

FLEXIBLE DISPLAY SUBSTRATES AND DISPLAY DEVICES

CROSS-REFERENCE TO RELATED APPLICATIONS

This application is a continuation of International Application No. PCT/CN2018/090260 filed on Jun. 7, 2018, which claims priority to Chinese patent application No. 201721111099.8 filed on Aug. 31, 2017. Both applications are incorporated herein in their entireties by reference.

TECHNICAL FIELD

Exemplary embodiments of the present application relate to the field of display technologies.

BACKGROUND

With the continuous advancement of technology and the continuous improvement of user demand, display screens of display devices such as mobile phones are gradually developed in directions of high resolution, narrow border and large screen. Large screen display devices may be inconvenient to carry, especially the mobile phones. Flexible display may be realized by Active Matrix Organic Light Emitting Diodes (AMOLEDs) according to advantages of the AMOLEDs. That is, display of different flexible forms such as folding, curling and twisting may be realized. Therefore, the display devices such as the mobile phones installing the AMOLEDs may be in expanded states (large screens) when used, and in folded states (small screens) when stored.

However, bending property of the existing flexible display substrate is poor.

SUMMARY

In view of this, the exemplary embodiments of the present application provide a flexible display substrate and a display device to solve a problem that bending property of the flexible display substrate may be reduced when a thickness of the conductive layer of the flexible display substrate is increased.

According to a first aspect, an exemplary embodiment of the present application provides a flexible display substrate. The flexible display substrate includes a flexible substrate and a conductive layer disposed on the flexible substrate. The conductive layer and the flexible substrate are divided into a bending area and a non-bending area along an extension direction. A thickness of the conductive layer in the bending area is smaller than a thickness of the conductive layer in the non-bending area.

In an exemplary embodiment of the present application, an upper edge of the conductive layer in the bending area along a non-extension direction is collinear with an upper edge of the conductive layer in the non-bending area.

In an exemplary embodiment of the present application, a lower edge of the conductive layer in the bending area along a non-extension direction is collinear with a lower edge of the conductive layer in the non-bending area.

In an exemplary embodiment of the present application, the upper edge of the conductive layer in the bending area along the non-extension direction is non-collinear with the upper edge of the conductive layer in the non-bending area; and the lower edge of the conductive layer in the bending area along the non-extension direction is non-collinear with the lower edge of the conductive layer in the non-bending area.

In an exemplary embodiment of the present application, one or both of the upper edge and the lower edge of the conductive layer in the bending area along the non-extension direction are zigzag edges.

In an exemplary embodiment of the present application, one or both of the upper edge and the lower edge of the conductive layer in the bending area along the non-extension direction are curved edges.

In an exemplary embodiment of the present application, one or both of the upper edge and the lower edge of the conductive layer in the bending area along the non-extension direction are wavy edges.

In an exemplary embodiment of the present application, a thickness of the conductive layer in the bending area is 200 nm to 400 nm.

In an exemplary embodiment of the present application, a thickness of the conductive layer in the non-bending area is 250 nm to 600 nm.

In an exemplary embodiment of the present application, the conductive layer in the bending area includes at least one hole.

In an exemplary embodiment of the present application, the conductive layer in the bending area includes an organic layer, and the organic layer is coated by the conductive layer.

In an exemplary embodiment of the present application, the flexible display substrate further includes an insulating layer between the flexible substrate and the conductive layer.

According to a second aspect, an exemplary embodiment of the present application further provides a display device. The display device includes the flexible display substrate described in any of the above exemplary embodiments.

In the exemplary embodiments of the present application, the flexible display substrate is divided into the bending area and the non-bending area, and the thickness of the conductive layer in the bending area is smaller than that in the non-bending area. Therefore, the resistance value of the conductive layer of the flexible display substrate is reduced without affecting bending property of the flexible display substrate in the bending area. And then, a necessary condition for applying the flexible display substrate to a large screen foldable display device is provided.

DETAILED DESCRIPTION

In order to make purposes, technical means and advantages of the present application clearer, the present application will be further described in detail below with reference to accompanying drawings.

Figure 1:
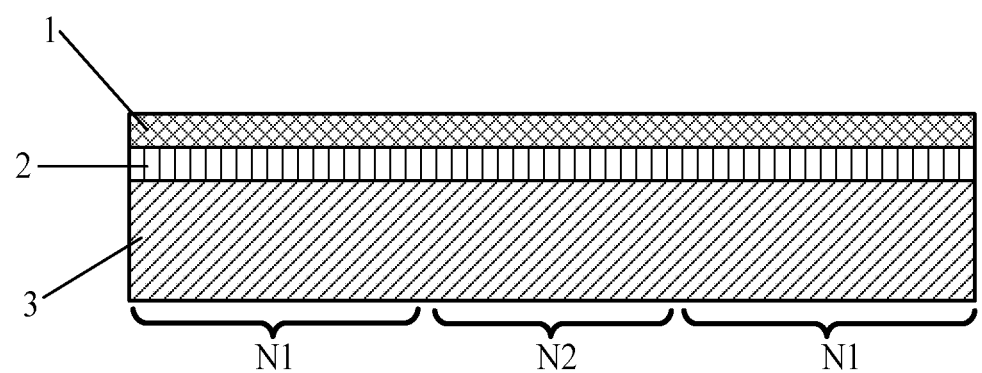
FIG. 1 is a schematic structural diagram of a flexible display substrate.

FIG. 1 is a schematic structural diagram of a flexible display substrate. As shown in FIG. 1, the flexible display substrate includes a metal layer 1, an insulating layer 2 and a flexible substrate 3 which are sequentially stacked in a top-down direction (a top-down direction shown in FIG. 1). In the flexible display substrate, a thickness of each component (i.e., the metal layer 1, the insulating layer 2 and the flexible substrate 3) in a non-bending area N1 and that in a bending area N2 are completely the same.

Figure 2:
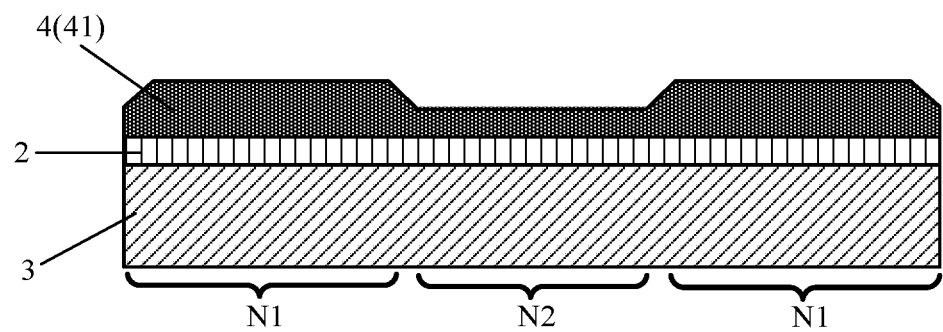
FIG. 2 is a schematic structural diagram of a flexible display substrate according to an exemplary embodiment of the present application.

FIG. 2 is a schematic structural diagram of a flexible display substrate according to an exemplary embodiment of the present application. As shown in FIG. 2, the flexible display substrate according to the exemplary embodiment of the present application includes a conductive layer 4, an insulating layer 2 and a flexible substrate 3 which are sequentially stacked in a top-down direction (a top-down direction shown in FIG. 2). The conductive layer 4, the insulating layer 2 and the flexible substrate 3 which are stacked in the top-down direction are divided into a bending area N2 and a non-bending area N1 along an extension direction. A thickness of the conductive layer 4 in the bending area N2 is smaller than a thickness of the conductive layer 4 in the non-bending area N1. That is, a lower edge (a lower edge shown in FIG. 2) of the conductive layer 4 in the bending area N2 and a lower edge (a lower edge shown in FIG. 2) of the conductive layer 4 in the non-bending area N1 are on the same horizontal line (i.e., collinear), and an upper edge (an upper edge shown in FIG. 2) of the conductive layer 4 in the bending area N2 is lower than an upper edge (an upper edge shown in FIG. 2) of the conductive layer 4 in the non-bending area N1 along the horizontal direction.

It may be noted that the extension direction mentioned in the exemplary embodiments of the present application refers to the horizontal direction, that is, a left-right direction shown in FIG. 2. A non-extension direction refers to a vertical direction, that is, the top-down direction shown in FIG. 2.

Theoretical basis of the exemplary embodiments of the present application is as follows.

A resistance of the conductive layer 4 before improvement is:

$$R1 = \rho L / S1 \qquad (1)$$

A current of the conductive layer 4 before the improvement is:

$$I1 = V/R1 = V/(\rho L/S1) \qquad (2)$$

In formula (1) and formula (2), S1=W*h1, W represents a width of the conductive layer 4, L represents a length of the conductive layer 4, h1 represents the thickness of the conductive layer 4, S1 represents a cross-sectional area of the conductive layer 4, ρ represents a density value of the conductive layer 4, R1 represents the resistance of the conductive layer 4, I1 represents the current of the conductive layer 4, and V represents a voltage value.

The resistance of the conductive layer 4 after the improvement is:

$$R1' = \rho L/S' = \rho\left(\frac{L1}{S1} + \frac{L2}{S2} + \frac{L3}{S3}\right) = \rho\left(\frac{L1}{S1} + \frac{L-L1}{S2}\right) \qquad (3)$$

The current of the conductive layer 4 after the improvement is:

$$I1' = V/R1' = V \bigg/ \left(\rho\left(\frac{L1}{S1} + \frac{L-L1}{S2}\right)\right) \qquad (4)$$

In formula (3) and formula (4), cross-sectional areas S1=W*h1, S2=W*(h1+h2), S2=S3, S1<S2, L1 represents a length of the conductive layer 4 in the bending area, L2 and L3 represent lengths of the thickened conductive layer 4 in the non-bending area, L1+L2+L3=L, S1 represents the cross-sectional area of the conductive layer 4 in the bending area, S2 and S3 represent the cross-sectional areas of the conductive layer 4 in the thickened non-bending area, I1' represents the current of the conductive layer 4 after the improvement and V represents the voltage value.

A comparison between the resistances before and after the improvement is:

$$R1 - R1' = \frac{\rho L}{S1} - \rho\left(\frac{L1}{S1} + \frac{L-L1}{S2}\right) = \rho\left(\frac{L}{S1} - \frac{L1}{S1} - \frac{L-L1}{S2}\right) = \rho(L-L1)\left(\frac{1}{S1} - \frac{1}{S2}\right) \qquad (5)$$

In formula (5), $$L - L1 > 0, \quad \frac{1}{S1} - \frac{1}{S2} > 0,$$

therefore, R1>R1'.

A comparison between the currents before and after the improvement is:

$$I1 - I1' = V/(\rho L/S1) - V \bigg/ \left(\rho\left(\frac{L1}{S1} + \frac{L-L1}{S2}\right)\right) \qquad (6)$$

In formula (6), it may be calculated according to calculation that I1−I1'<0, that is, I1<I1'.

In summary, it may be concluded from the above analysis that after the thickness is increased, the resistance of the conductive layer 4 may be effectively reduced, and the current of the conductive layer 4 may be effectively increased.

In the exemplary embodiments of the present application, the flexible display substrate is divided into the bending area and the non-bending area, and the thickness of the conductive layer in the bending area is smaller than that in the non-bending area. Therefore, the resistance value of the conductive layer of the flexible display substrate is reduced, and the current value of the conductive layer of the flexible display substrate is improved without affecting bending property of the flexible display substrate in the bending area. And then, a necessary condition for applying the flexible display substrate to a large screen foldable display device is provided.

It may be understood that, in an exemplary embodiment of the present application, the upper edge (the upper edge shown in FIG. 2) of the conductive layer 4 in the bending area N2 and the upper edge (the upper edge shown in FIG. 2) of the conductive layer 4 in the non-bending area N1 are at the same horizontal line (i.e., collinear). The lower edge (the lower edge shown in FIG. 2) of the conductive layer 4 in the bending area N2 is higher than the lower edge (the lower edge shown in FIG. 2) of the conductive layer 4 in the non-bending area N1 along the horizontal direction. Therefore, the thickness of the conductive layer 4 in the bending area N2 is smaller than the thickness of the conductive layer 4 in the non-bending area N1. In this way, adaptability and expandability of the flexible display substrate may be sufficiently increased according to the exemplary embodiment of the present application.

In addition, it may be noted that specific setting ranges and setting locations of the bending area N2 and the non-bending area N1 may be freely set according to an actual situation, and which are not limited herein.

Preferably, the conductive layer 4 in an exemplary embodiment of the present application is set as a metal layer 41, so that a conductive effect may be better exerted by the conductive layer 4.

It may be understood that the conductive layer 4 may be made with a material such as conductive plastic or conductive rubber and so on, which is not limited in this present application.

Figure 3:
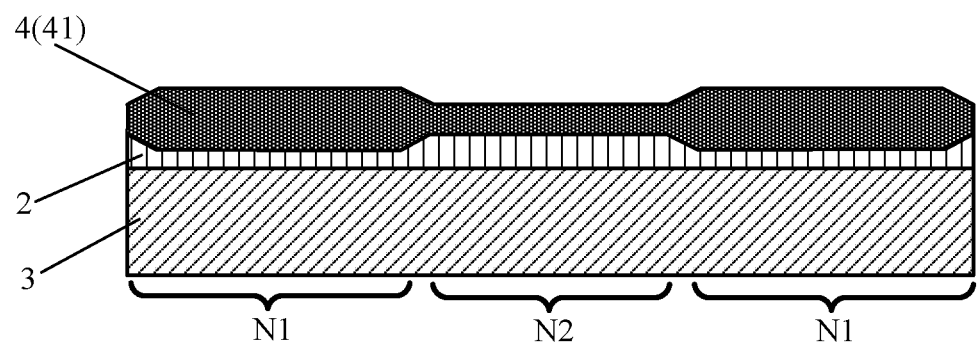
FIG. 3 is a schematic structural diagram of a flexible display substrate according to another exemplary embodiment of the present application.

FIG. 3 is a schematic structural diagram of a flexible display substrate according to another exemplary embodiment of the present application. The exemplary embodiment of the present application is extended on the basis of the exemplary embodiment shown in FIG. 2 of the present application. Differences will be described below, and similarities are not described again. As shown in FIG. 3, in the flexible display substrate according to the exemplary embodiment of the present application, an upper edge (an upper edge shown in FIG. 3) of a conductive layer 4 in a non-bending area N1 is higher than an upper edge (an upper edge shown in FIG. 3) of the conductive layer 4 in a bending area N2 along an extension direction (i.e., the horizontal direction). A lower edge (a lower edge shown in FIG. 3) of the conductive layer 4 in the non-bending area N1 is lower than a lower edge (a lower edge shown in FIG. 3) of the conductive layer 4 in the bending area N2 along the extension direction (i.e., the horizontal direction).

In the flexible display substrate according to the exemplary embodiment of the present application, the upper edge of the conductive layer in the non-bending area is higher than the upper edge of the conductive layer in the bending area along the extension direction (i.e., the horizontal direction), and the lower edge of the conductive layer in the non-bending area is lower than the lower edge of the conductive layer in the bending area along the extension direction (i.e., the horizontal direction). That is, the thickness of the conductive layer in the non-bending area is respectively increased from both sides in the non-extension direction (i.e., the vertical direction) of the conductive layer in the non-bending area. Therefore, a resistance value of the conductive layer of the flexible display substrate is better reduced without affecting bending property of the flexible display substrate in the bending area.

It may be understood that in the flexible display substrates described in the above exemplary embodiments of the present application, the upper edge and/or the lower edge of the conductive layer 4 in the non-bending area N1 and the corresponding upper edge and/or the corresponding lower edge of the conductive layer 4 in the bending area N2 are at the same horizontal line. However, the upper edge and/or the lower edge of the conductive layer 4 in the non-bending area N1 and the corresponding upper edge and/or the corresponding lower edge of the conductive layer 4 in the bending area N2 may be just collinear, and are not required to be on the horizontal line.

Figure 4:
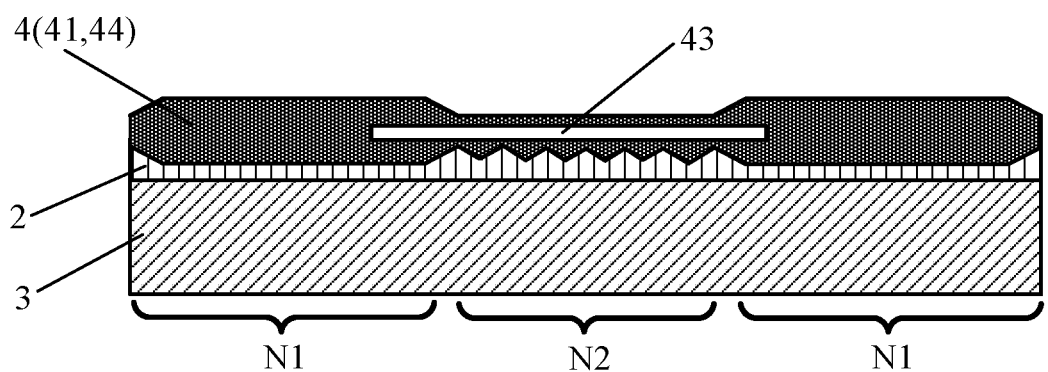
FIG. 4 is a schematic structural diagram of a flexible display substrate according to still another exemplary embodiment of the present application.

FIG. 4 is a schematic structural diagram of a flexible display substrate according to still another exemplary embodiment of the present application. The exemplary embodiment of the present application is extended on the basis of the exemplary embodiment shown in FIG. 3 of the present application. Differences will be described below, and similarities are not described again. As shown in FIG. 4, in the flexible display substrate according to the exemplary embodiment of the present application, a lower edge (a lower edge shown in FIG. 4) of a conductive layer 4 in a bending area N2 is a zigzag edge.

In the flexible display substrate according to the exemplary embodiment of the present application, the lower edge (the lower edge shown in FIG. 4) of the conductive layer in the bending area of the flexible display substrate is set as the zigzag edge. Therefore, bending property of the conductive layer in the bending area is improved, especially bending property of upward bending (an upward direction shown in FIG. 4).

It may be understood that an upper edge (an upper edge shown in FIG. 4) of the conductive layer 4 in the bending area N2 of the flexible display substrate may be set as a zigzag edge. Therefore, the bending property of the conductive layer 4 in the bending area N2 is improved, especially bending property of downward bending (a downward direction shown in FIG. 4).

Figure 5:
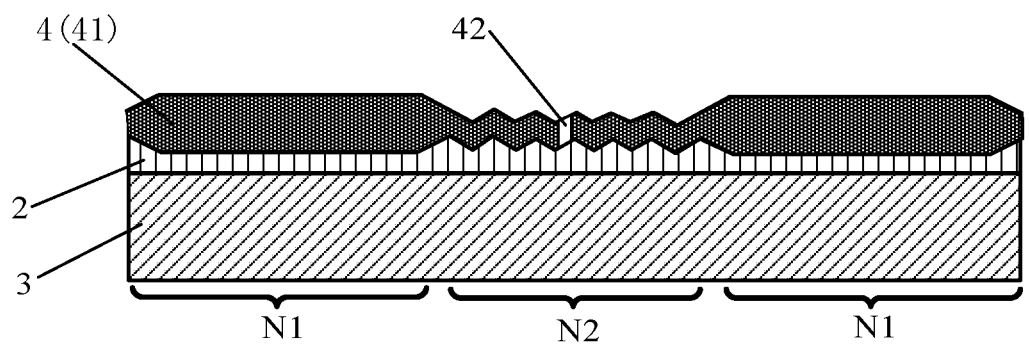
FIG. 5 is a schematic structural diagram of a flexible display substrate according to yet still another exemplary embodiment of the present application.

FIG. 5 is a schematic structural diagram of a flexible display substrate according to yet still another exemplary embodiment of the present application. The exemplary embodiment of the present application is extended on the basis of the exemplary embodiment shown in FIG. 4 of the present application. Differences will be described below, and similarities are not described again. As shown in FIG. 5, in the flexible display substrate according to the exemplary embodiment of the present application, an upper edge and a lower edge (an upper edge and a lower edge shown in FIG. 5) along a non-extension direction (i.e., a vertical direction) of a conductive layer 4 in a bending area N2 are both zigzag edges.

In the flexible display substrate according to the exemplary embodiment of the present application, the upper edge and the lower edge (the upper edge and the lower edge shown in FIG. 5) of the conductive layer in the bending area of the flexible display substrate are set as zigzag edges. Therefore, bending property of the conductive layer in the bending area is improved, especially bending property of bending along the non-extension direction. That is, bending property of upward bending (an upward direction shown in FIG. 5) and bending property of downward bending (a downward direction shown in FIG. 5).

It may be understood that in the flexible display substrate mentioned in the above exemplary embodiments, the upper edge and/or the lower edge of the conductive layer 4 in the bending area N2 may also be a curved edge and/or a wavy edge. That is, the upper edge and the lower edge of the conductive layer 4 in the bending area N2 are not limited to the zigzag edges according to the above exemplary embodiments of the present application. Specific shapes of the upper edge and the lower edge are not described herein again in the exemplary embodiments of the present application.

In an exemplary embodiment of the present application, a conductive layer 4 in a bending area N2 of the flexible display substrate includes at least a hole 42, so as to fully enhance bending property of the conductive layer 4 in the bending area N2. A specific setting position and a setting manner of the hole 42 are not described in detail in the exemplary embodiment of the present application. Any specific setting position and setting manner of the hole 42 that may be easily conceived by those skilled in the art may be included in the exemplary embodiment of the present application.

In an exemplary embodiment of the present application, a conductive layer 4 in a bending area N2 of a flexible display substrate includes an organic layer 43. The organic layer 43 is coated by the conductive layer 4. Therefore, conductive function is realized by the conductive layer 4, and bending property of the conductive layer 4 is enhanced by the organic layer 43.

In an exemplary embodiment of the present application, a conductive layer 4 is a metal layer 41, and the metal layer 41 includes a plurality of metal lines. Each of the metal lines includes an organic layer 43 and a reinforcing conductive layer 44. The organic layer 43 is coated by the reinforcing conductive layer 44. A specific coating manner between the organic layer 43 and the reinforcing conductive layer 44 of each metal line is not described in detail in the exemplary embodiment of the present application. Any specific coating manner between the organic layer 43 and the reinforcing conductive layer 44 that may be easily conceived by those skilled in the art may be included in the exemplary embodiment of the present application.

In an exemplary embodiment of the present application, preferably, a thickness of a conductive layer 4 in a bending area N2 is 200 nm to 400 nm. A thickness of the conductive layer 4 in a non-bending area N1 may be set according to an actual condition, and only needs to be larger than the thickness of the conductive layer 4 in the bending area N2. Therefore, by means of setting the thickness of the conductive layer 4 in the bending area N2 to be 200 nm to 400 nm, better bending property of a flexible display substrate is enabled while resolution of the flexible display substrate is maintained.

In an exemplary embodiment of the present application, preferably, a thickness of a conductive layer 4 in a non-bending area N1 is 250 nm to 600 nm. A thickness of the conductive layer 4 in a bending area N2 may be set according to an actual condition, and only needs to be smaller than the thickness of the conductive layer 4 in the non-bending area N1. Therefore, by means of setting the thickness of the conductive layer 4 in the non-bending area N1 to be 250 nm to 600 nm, better bending property of a flexible display substrate is enabled while conductive resistance of the flexible display substrate is maintained.

A display device includes the flexible display substrate described in any of the above exemplary embodiments.

It may be understood that the display device includes, but is not limited to, an electronic device such as a mobile phone, a tablet computer, a notebook computer and so on.

Above exemplary embodiments are only the preferred exemplary embodiments of the present application, and are not intended to limit the scope of the present application. Any modification, equivalent substitution, improvement made within the spirit and principles of the present application are intended to be included within the scope of the present application.

What is claimed is:

1. A flexible display substrate, comprising a flexible substrate and a conductive layer disposed on the flexible substrate,
wherein the conductive layer and the flexible substrate are divided into a bending area and a non-bending area along an extension direction, and
wherein the conductive layer in the non-bending area is configured to be more than 20% thicker than the conductive layer in the bending area to reduce a resistance of the conductive layer without affecting the bending property of the flexible substrate.

2. The flexible display substrate of claim 1, wherein an upper edge of the conductive layer in the bending area along a non-extension direction is collinear with an upper edge of the conductive layer in the non-bending area.

3. The flexible display substrate of claim 1, wherein a lower edge of the conductive layer in the bending area along a non-extension direction is collinear with a lower edge of the conductive layer in the non-bending area.

4. The flexible display substrate of claim 1, wherein an upper edge of the conductive layer in the bending area along a non-extension direction is non-collinear with an upper edge of the conductive layer in the non-bending area, and a lower edge of the conductive layer in the bending area along a non-extension direction is non-collinear with a lower edge of the conductive layer in the non-bending area.

5. The flexible display substrate of claim 1, wherein an upper edge of the conductive layer in the bending area along a non-extension direction is one of a zigzag edge, a curved edge and a wavy edge.

6. The flexible display substrate of claim 5, wherein a lower edge of the conductive layer in the bending area along a non-extension direction is one of a zigzag edge, a curved edge and a wavy edge.

7. The flexible display substrate of claim 1, wherein a lower edge of the conductive layer in the bending area along a non-extension direction is one of a zigzag edge, a curved edge and a wavy edge.

8. The flexible display substrate of claim 1, wherein a thickness of the conductive layer in the bending area is 200 nm to 400 nm.

9. The flexible display substrate of claim 1, wherein a thickness of the conductive layer in the non-bending area is 250 nm to 600 nm.

10. The flexible display substrate of claim 1, wherein the conductive layer in the bending area comprises at least a hole.

11. The flexible display substrate of claim 1, wherein the conductive layer in the bending area comprises an organic layer, and the organic layer is coated by the conductive layer.

12. The flexible display substrate of claim 1, further comprising an insulating layer between the flexible substrate and the conductive layer.

13. A display device, comprising the flexible display substrate of claim 1.

* * * * *